United States Patent [19]

Kasai et al.

[11] Patent Number: 5,021,749
[45] Date of Patent: Jun. 4, 1991

[54] SWITCHABLE CAPACITOR LOOP FILTER FOR PHASE LOCKED LOOP

[75] Inventors: Kenichiro Kasai; Takeshi Kawasaki, both of Suwa, Japan

[73] Assignee: Seiko Epson Corporation, Nagano, Japan

[21] Appl. No.: 456,609

[22] Filed: Dec. 28, 1989

Related U.S. Application Data

[63] Continuation of Ser. No. 350,349, May 11, 1989, abandoned.

[30] Foreign Application Priority Data

May 11, 1988 [JP] Japan .................. 63-115216
Jan. 11, 1989 [JP] Japan .................. 1-4043

[51] Int. Cl.$^5$ .............................................. H03L 7/10
[52] U.S. Cl. ....................................... 331/17; 331/14; 328/155
[58] Field of Search .............. 331/14, 17; 328/155

[56] References Cited

U.S. PATENT DOCUMENTS 4,524,333 6/1985 Iwata et al. ..................... 331/17

*Primary Examiner*—Siegfried H. Grimm
*Attorney, Agent, or Firm*—Spensley, Horn, Jubas & Lubitz

[57] ABSTRACT

A phase-locked loop circuit having a loop filter supplied with a detection indication of a phase difference between an input signal and an output signal from a voltage-controlled oscillator to control the oscillation of the voltage-controlled oscillator. The loop filter includes a first capacitance element connected between an output terminal of the loop filter and a first power supply potential point, a second capacitance element connected between the output terminal and a second power supply potential point, a third capacitance element connected in parallel to the first capacitance element when a first indication is obtained by the detection of a phase difference, a fourth capacitance element connected in parallel to the second capacitance element when a second indication is obtained by the detection of a phase difference, and control members for forming a first current path between the output terminal and the first power supply potential point when the first indication is obtained and for forming a second current path between the output terminal and the second power supply potential point when the second indication is obtained. The phase-locked loop circuit can be readily fabricated in the form of an integrated circuit, and it is possible to conduct a lock-in operation speedily and reliably at the time when the circuit power supply is turned on.

12 Claims, 1 Drawing Sheet

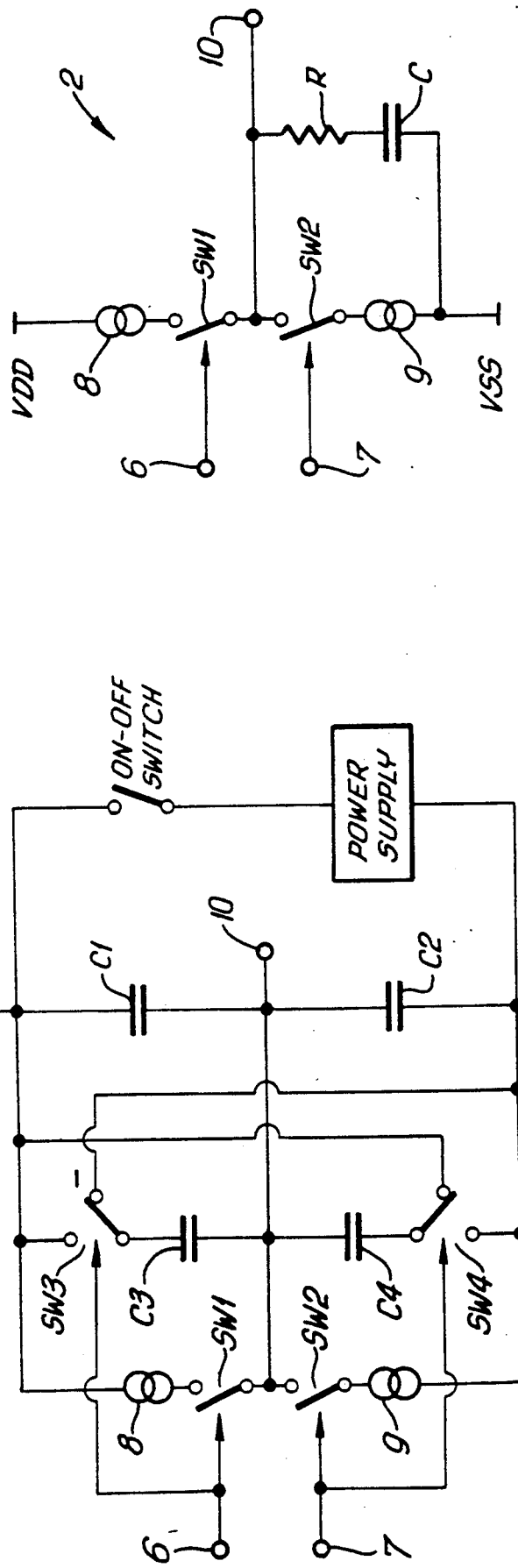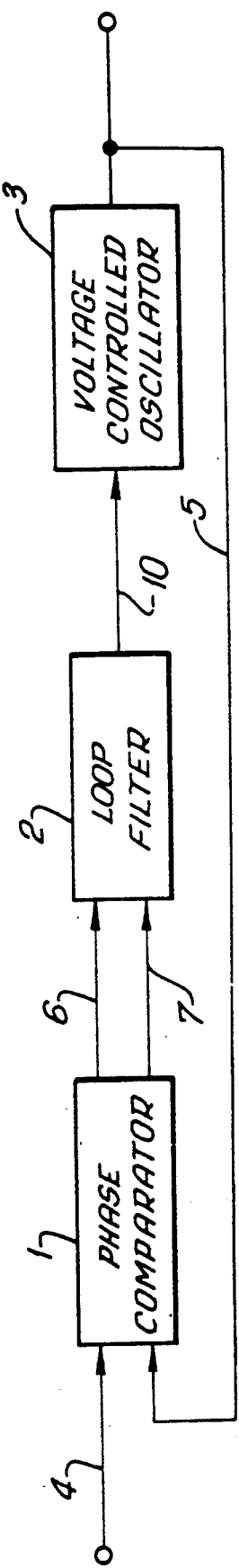

SWITCHABLE CAPACITOR LOOP FILTER FOR PHASE LOCKED LOOP

This is a continuation of application Ser. No. 07/350,349 filed on May 11, 1989, now abandoned.

BACKGROUND OF THE INVENTION

1. Field of the Invention

The present invention relates to a phase-locked loop circuit and, more, particularly, to a loop filter that is used therein.

2. Description of the Related Art

FIG. 2 is a block diagram of a typical conventional phase-locked loop circuit composed of a phase comparator 1 which performs detection of a phase difference, a loop filter 2, and a voltage-controlled oscillator 3. An input signal is supplied to one input of comparator 1 via a line 4 and an output signal is produced by oscillator 3 on line 5. The signal on line 5 is fed back to the phase comparator 1, thus forming a phase-locked loop circuit. Comparator 1 produces a phase advance signal 6 and a phase delay signal 7 which are supplied to filter 2. Loop filter 2 generates an output signal on line 10 which is input to voltage-controlled oscillator 3 as an oscillation control signal.

Upon detecting a phase difference between the signals on lines 4 and 5, comparator 1 generates either the signal 6 or 7 to control the voltage-controlled oscillator 3 through the loop filter 2 in a direction to reduce a phase difference.

FIG. 3 shows one example of a loop filter used in conventional phase-locked loop circuits. The illustrated loop filter includes a charging source constituted by a combination of constant-current sources 8 and 9 each producing driving current $I_O$, switches SW1 and SW2 and a low-pass filter which is constituted by a resistor R with a resistance value $R_O$, and a capacitor C with a capacitance value $C_O$. Switches SW1 and SW2 are preferably semiconductor devices.

Assuming that a leading phase difference with a time duration t1 is detected, the phase advance signal 6 is produced so that SW1 turns ON. As a result, the voltage level of the output signal on line 10 of loop filter 2 instantaneously rises by $I_O \times R_O$) and further a voltage rise corresponding to the amount by which capacitor C is charged by curent source 8 is gradually added to output signal on line 10. The voltage rise reaches $(I_O \times t_1)/C_O$ after the time $t_1$. When the phase difference becomes zero, SW1 is turned OFF, so that the voltage held across the caparitor C is outputted as the output on line 10 of loop filter 2.

Conversely, when the phase delay signal 7 is produced SW2 turns ON. As a result, a voltage decrease $(I_O \times R_O)$ is caused and the charge held in capacitor C is also gradually removed, so that the output signal 10 of loop filter 2 continuously decreases as long as a lagging phase difference is detected. When the phase difference becomes zero, SW2 turns OFF, and the voltage across the capacitor C is outputted again as the output signal on line 10 of loop filter 2.

Thus, loop filter 2 may be regarded as a phase-to-voltage converter which outputs a voltage corresponding to a phase difference detected by the phase comparator. In accordance with the converted voltage output, the voltage-controlled oscillator is controlled such that a phase difference detected is corrected continuously.

The above-described conventional phase-locked loop circuit suffers, however from the following problems. The first problem is that it is difficult to fabricate the conventional phase-locked loop circuit in the form of an integrated circuit. More specifically, since the conventional loop filter includes a low-pass filter which comprises a resistor R and a capacitor C, if the resistance value R varies, the change in voltage ($I_O \times R_O$) also varies as a matter of course. Accordingly, it is necessary in order to obtain stable loop filter characteristics to minimize variations in the resistance value of resistor R.

On the other hand, the capacitance value that is employed for a loop filter fabricated in the form of an integrated circuit is limited to several tens of pF because of limitations on area. Accordingly, $I_O$ must be reduced in dependence on $C_O$ in order to fabricate a loop filter having the conventional arrangement in the form of an integrated circuit without altering the rate of change of the voltage level ($I_O \times t_1$)/$C_O$ as the capacitor C is charged or discharged for the time $t_1$ with the constant current $I_O$ in response to a detected phase difference. At the same time, when $I_O$ is reduced, the instantaneous change in voltage ($I_O \times R_O$) would also decrease; therefore, $R_O$ must be increased in order to achieve the desired instantarneous voltage change.

More specifically, let us consider a phase-locked loop circuit the transfer function H(S) of which is expressed as follows:

$$H(S) = \frac{2\xi WnS + Wn^2}{S^2 + 2\xi WnS + Wn^2} \quad (1)$$

In expression (1), Wn is the natural angular frequency, S is the Laplace c,perator and $\xi$ is the damping coefficient. Wn and $\xi$ are expressed as follows:

$$Wn = \left(\frac{K}{C}\right)^{\frac{1}{2}} \quad (2)$$

$$\xi = \frac{1}{2} KR \left(\frac{C}{K}\right)^{\frac{1}{2}} \quad (3)$$

$$= \frac{1}{2} CRWn$$

In these expressions, C and R denote the respective values of the capacitor and resistor which constitute in combination the loop filter, while K denotes the closed-loop gain of the phase-locked loop circuit. The closed-loop gain K is given by the product of the charge-and-discharge current I of the constant-current sources constituting a charge pump and the conversion coefficient Kv of the voltage-controlled oscillator as follows:

$$K = I \times Kv \quad (4)$$

To design a phase-locked loop circuit, it is general practice to determine optimal values for Wn and $\xi$ and then select constants for the loop filter in conformity with the determined values. For example, in the case of the phase-locked loop circuit of a data separator which is employed in a floppy disk drive, Wn and $\xi$ are selected as shown telow so that the output of the circuit will not follow a jitter (peak shift) of a read data input:

$Wn = 30 \times 10^3$[rad/s]

$\xi = 0.7$

Let us obtain loop filter constants with which the above-described values for Wn and $\xi$ are obtained. Assuming that the conversion coefficient Kv of the voltage-controlled oscillator is $75 \times 10^3 [H_Z/v]$ and C is 50pF, K is obtained from the expression (2) as follows:
K=CWn²
=0.045

Accordingly, the current source current I is obtained from equation (4) as follows:
I=K/Kv
=0.6[μA]

On the other hand, the resistance R is obtained from the expression (3) as follows:

$$R = \frac{2 \cdot \xi}{CWn}$$
$$= 933.3 [k\Omega]$$

Thus, a considerably high resistance value is calculated.

As has been described above, the resistance R of the loop filter when fabricated in the form of an integrated circuit must have a high precision and yet a high resistance value. Examples of resistors which may be used in integrated circuits include diffusion resistors and polycrystalline resistors. The former type of resistor has a relatively high resistance and is therefore advantageous from the viewpoint of area but it exhibits large variations in the resistance value. In the case of the latter type cf resistor, on the other hand, the resistance value accuracy is high, but it is disadvantageous from the viewoint of area. Accordingly, in either case, it is difficult to fabricate a phase-locked loop circuit in the form of an integrated circuit without a change in the arrangement of the conventional loop filter.

The second problem of the prior art is concerned with a lock-in oper.ation that is performed at the time when the power supply is turned ON. Immediately after the power supply has been turned ON, voltage across the capacitor C of the loop filter is zero and, therefore, the oscillation control signal on line 10 applied to the voltage-controlled oscillator 3 in the arrangement shown in FIG. 2 is also at the zero level. Accordingly, at the time when the power supply is turned ON, the frequency of the voltage-controlled oscillator 3 differs from the so-called lock frequency (center frequency) by a substantial amount, so that it takes a long time to reach a locked state from the deviated state. If the gain of the loop filter is increased in order to reduce the lock-in time, it becomes easy for the output of the loop filter to follow input jitters after a locked state has been reached; therefore, it is not preferable to increase the gain of the loop filter. If the sensitivity to jitters is lowered, it takes a relatively long time to effect lock-in and, in an extreme case, it is impossible to reach a normal locked state.

It has also been proposed to manufacture such loop filters as analog, or nonintegrated, devices external to an integrated circuit containing the other phase-locked loop components. However, it is inconvenient to connect such filter to the integrated circuit and to accurately adjust the operating parameters of the analog filter.

SUMMARY OF THE INVENTION

In view of the above-described problems of the prior art, it is a primary object of the present invention to provide a phase-locked loop circuit which can be readily fabricated in the form of an integrated circuit and which can effect a lock-in operation speedily and reliably at the time when the power supply is turned ON.

To this end, according to a first aspect of the present invention, there is provided a phase-locked loop circuit having a loop filter supplied with signals representative of a phase difference between an input signal and an output signal from a voltage-controlled oscillator to control the oscillation of the voltage controlled oscillator, wherein the loop filter comprises: a first capacitarce element connected between an output terminal of the loop filter and a first power supply potential point; a second capacitance element connected between the output terminal and a second power supply potential point; a third capacitance element connected in parallel with the first capacitance element when a first result is obtained by the detection of a phase difference; a fourth capacitance element connected in parallel with the second capacitance element when a second result is obtained by the detection of a phase difference; and means for forming a first current path between the output terminal and the first power supply potential point when the first result is obtained, and for forming a second current path between the output terminal and the second power supply potential point when the second result is obtained.

According to a second aspect of the present invention, there is provided a phase-locked loop circuit having a loop filter supplied with a result of detection of a phase difference between an input signal and an output signal from a voltage-controlled oscillator so that the oscillation of the voltage-controlled oscillator is controlled by the output of the loop filter, wherein the loop filter comprises a plurality of capacitance elements, an output terminal, first and second power supply terminals, and switching means for switching the connection of &he capacitance elements, the switching means being arranged such that: when the power supply has been just turned ON, the switching means operates such that the number of capacitance elements which are connected in parallel between the output terminal and the first power supply terminal is equal to the number of capacitance elements which are connected in parallel betweer the output terminal and the second power supply terminal; when a first result is obtained by the detection of a phase difference, the switching means operates such that the number of capacitance elements which are connected in parallel between the output terminal and the first power supply terminal is larger than the rumber of capacitance elements which are connected between the output terminal and the second power supply terminal; and when a second result is obtained by the detection of a phase difference, the switching means operates such that the number of capacitance elements which are connected in parallel between the output terminal and the second power supply terminal is greater than the number of capacitance elements which are connected between the output terminal and the first power supply terminal.

The above and other objects, features and advantages advantages of the present invention will become more apparent from the following description of the preferred embodiment thereof, taken in conjunction with the accompanying drawings.

The capacitance elements thus provide both the resistance and the capacitance components for the loop filter.

BRIEF DESCRIPTION OF THE DRAWINGS

FIG. 1 is a circuit diagram showing one embodiment of the present invention.

FIG. 2 is a block diagram showing one example o phase-locked loop circuit.

FIG. 3 is a circuit diagram of a conventional loop filter.

DESCRIPTION OF THE PREFERRED EMBODIMENT

One embodiment of the present invention will be described hereinunder in detail with reference to FIG. 1 which shows the arrangement of a loop filter according to the present invention employed in a phase-locked loop circuit. In the Figure, the same elements as those shown in FIG. 3 are denoted by the same reference numbers and the loop filter additionally includes two further switches SW3 and SW4, preferably semiconductor devices, and capacitors C1–C4. Also shown is a power supply equipped with an on-off switch for selectively establishing a voltage between power supply terminals VDD and VSS.

When the power supply has been just turned ON, neither of the phase difference detection signals 6 and 7 are being produced and SW1–SW4 are in their respective positions shown in FIG. 1. At this time, output line 10 of the loop filter has a voltage level obtained by dividing the potential difference between two power supply terminals $V_{DD}$ and $V_{SS}$ by the sum total of parallel capacitances $C_1$, $C_4$ and parallel capacitances $C_2$, $C_3$. More specifically, capacitors $C_1$ and $C_4$ are connected in parallel between the power supply terminal $V_{DD}$ and the output terminal 10, and capacitors $C_2$ and $C_3$ are connected in parallel between the output terminal 10 and the power supply terminal VSS. Accordingly, if, for example, $C_1=C_2$ and $C_3=C_4$, then, when the power supply is turned ON, the output 10 instantaneously reaches $V_{DD}/2$ ($V_{SS}=0V$). If the voltage-controlled oscillator 3 of FIG. 2 is arranged to oscillate at the lock frequency when the oscillation control signal is at a level of $V_{DD}/2$, it is obvious that the phase-locked loop circuit of the present invention is quickly locked when the power supply is turned ON.

The following is a description of the operation of the phase-locked loop circuit that occurs when the phase delay signal 7 is produced. At this time, SW2 turns ON and SW4 is switched over to the negative-side power supply potential $V_{SS}$. Accordingly, only capacitor $C_1$ is connected between the power supply terminal $V_{DD}$ and output line 10, while capacitors $C_2$, $C_3$ and $C_4$ are connected in parallel between the output line 10 and the power supply terminal $V_{SS}$. In other words, the voltage on output line 10 of the loop filter is instantaneously lowered to a voltage level obtained by dividing the potential difference between the two power supply terminals $V_{DD}$ and $V_{SS}$ by the sum total of the capacitance $C_1$ and the parallel capacitance $C_2$, $C_3$ and $C_4$. Thereafter, discharge is effected via current source 9 and, therefore, the output level is further lowered. As a result, the oscillation frequency of the voltage-controlled oscillator is raised to correct the delay in phase.

Let it be assumed that a voltage change $\delta Va$ is caused by a change in the capacitive potential dividing ratio which is, in turn, caused by a change in operating state from the locked state described initially to the state created by detection of a phase delay.

In the case where the voltage level of the oscillation control signal in the locked state is $V_{DD}/2$, if $C_1=C_2$ and $C_3=C_4$, $V_{DD}/2$ is expressed as follows:

$$\frac{V_{DD}}{2} = \frac{C_1 + C_4}{C_1 + C_2 + C_3 + C_4} V_{DD} \quad (5)$$

Therefore, $\delta Va$ is expressed as follows:

$$\delta Va = \left( \frac{C_1 + C_4}{C_1 + C_2 + C_3 + C_4} - \frac{C_1}{C_1 + C_2 + C_3 + C_4} \right) V_{DD} \quad (6)$$

$$= \frac{C_4}{C_1 + C_2 + C_3 + C_4} V_{DD}$$

It is clear that in the conventional loop filter shown in FIG. 3 the voltage change $\delta Vb$, which is equivalent to the above, caused when a phase delay is detected, is expressed as follows:

$$\delta Vb = I_0 \times R_0 \quad (7)$$

It will be understood from the comparison between the expressions (6) and (7) that the following relation is equivalently valid, assuming $\delta Va = \delta Vb$:

$$R_0 = \frac{C_4}{C_1 + C_2 + C_3 + C_4} \cdot \frac{V_{DD}}{I_0} \quad (8)$$

The expression (8) shows that in the loop filter according to the present invention the apparent resistance value is determined by the capacitance ratio and the current value of the constant-current source.

When phase advance signal 6 is produced, SW1 turns ON and SW3 is switched over to the positive-side power supply potential $V_{DD}$. Accordingly, $C_1$, $C_3$ and $C_4$ are connected in parallel between the power supply terminal $V_{DD}$ and the output terminal 10, while $C_2$ is connected between the output terminal 10 and the power supply terminal $V_{SS}$. At this time, the output 10 of the loop filter is instantaneously raised to a voltage level obtained by dividing the potential difference between the two power supply terminals $V_{DD}$ and $V_{SS}$ by the sum total of the parallel capacitance $C_1$, $C_3$ and $C_4$ and the capacitance $C_2$ and, at the same time, charging is effected by current source 8. In this case, the voltage change $\delta Va'$ that is equivalent to the above-mentioned $\delta Va$ is expressed as follows:

$$\delta Va' = \left( \frac{C_1 + C_3 + C_4}{C_1 + C_2 + C_3 + C_4} - \frac{C_1 + C_4}{C_1 + C_2 + C_3 + C_4} \right) V_{DD} \quad (9)$$

$$= \frac{C_3}{C_1 + C_2 + C_3 + C_4} \cdot V_{DD}$$

Since $C_3 = C_4$, $\delta Va = \delta Va'$.

It has been stated that the voltage change $\delta Vb$ in the conventional loop filter is expressed by the equation (6) or (9) in the case of the loop filter of the present invention, and this value is determined simply by the capacitance ratio, provided that the power supply voltage is constant. It is well known that the capacitance ratios can be established with a very high degree of accuracy in integrated circuits. Accordingly, it is, as a matter of course, possible to minimize variations in δVa and δVa'.

Further, the apparent resistance of the loop filter is given by equation (8) and, therefore, it increases naturally as $I_O$ decreases. Accordingly in the present invention, the araa that is required to form a resistance region will not increase in proportion to an increase in the resistance value as in the case of the conventional loop filter.

It will be assumed that loop filter constants whereby the above-mentioned characteristics, i.e., Wn=30K[rad/s] and ξ=0.7, are obtained are selected according to the present invention.

The current produced by each constant-current source constituting a charge pump is assumed to be one-half half of the value in the case described above, that is I=0.3 νA. Since Wn is expressed by equation (2), the value of Wn is unchanged if the capacitance C (C=$C_1+C_2+C_3+C_4$ in this case) is also reduced by ½, in proportion to the decrease of I, that is the decrease of the closed loop gain K to ½. Accordingly, C is set at 25 pF.

On the other hand, the resistance R is expressed, for example, by the expression (8). If Wn is constant and the time constant CR of the loop filter is constant, the damping coefficient is constant. Since the capacitance is halved, the resistance R should be doubled. Equation (8) may be modified as follows:

$$\frac{C_4}{C_1 + C_2 + C_3 + C_4} = \frac{I \times R}{V_{DD}} \quad (10)$$

Therefore, a capacitance ratio which corresponds to doubling the equivalent resistance value is obtained by using I=0.3 μA, R=(933.3×2)kΩ and $V_{DD}$=5V in equation (10). If the sum total of the capacitances ($C_1+C_2+C_3+C_4$) is assumed to be 25 pF, the expression (10) is solved to obtain a value for $C_4$ of:

$C_4$=2.8 pF

Specific values of the capacitors that constitute, in combination, a loop filter according to the invention should be set as follows: $C_1=C_2$=9.7 pF and $C_3=C_4$=2.8 pF. If these values are inserted in equation (8) for the purpose of confirmation, the resistance R is obtained as follows:

R=1.867 (MΩ)

Therefore, it is confirmed that the resistance value is doubled.

Thus, the present invention enables the capacitance C to be readily reduced so as to be suitable for an integrated circuit with the time constant CR kept constant.

As has been described above, the present invention enables a phase-locked loop circuit, including a loop filter, to be fabricated in the form of an integrated circuit quite advantageously from the viewpoint of both accuracy and area and hence permits the cost of manufacture to be markedly reduced. Further, since the level of the oscillation control signal which is applied to the voltage-controlled oscillator is instantaneously determined when the power supply is turned ON, the initial lock-in operation is conducted speedily and reliably.

The present invention may be applied not only to the data separator of a floppy disk apparatus but also to phase-locked loop circuits used in various kinds of electronic devices.

Although the present invention has been described through specific terms, it should be noted here that the described embodiment is not necessarily exclusive and that various changes and modification may be imparted thereto without departing from the scope of the invention which is limited solely by the appended claims.

What is claimed is:

1. A filter for supplying a control voltage for a voltage-controlled oscillator in response to the input of either one of a first indication or a second indication, wherein said filter comprises:
   (a) means including first and second power supply potential points between which a fixed potential difference is established, and an output terminal connected to supply a control signal to the oscillator;
   (b) a first capacitance element connected between said first power supply potential point and said output terminal;
   (c) a second capacitance element connected between said second power supply potential point and said output terminal;
   (d) third and fourth capacitance elements; and
   (e) control means connected for selectively connecting said third capacitance element in parallel with said first capacitance element and forming a first current path between said first power supply potential point and said output terminal in response to production of the first indication, and for selectively connecting said fourth capacitance element in parallel with said second capacitance element and forming a second current path between said second power supply potential point and said output terminal in response to production of the second indication.

2. A filter according to claim 1, wherein said third capacitance element is connected in parallel with said second capacitance element when said second indication is produced, and said fourth capacitance element is connected in parallel with said first capacitance element when said first indication is produced.

3. A filter according to claim 2, wherein said control means comprise current charging means for raising the potential at said output terminal and current discharging means for lowering the potential at said output terminal.

4. A filter according to claim 3, wherein each indication is representative of a respective polarity of the difference in phase between an input signal and a sional based on the output of the oscillator.

5. A filter according to claim 2, wherein said control means comprise: a first switching element which is switched into a state to form said first current path when the first indication is produced; a second switching element is switched in a state to form said second current path when the second indication is produced; a third switching element connected to operate such that, when the first indication is produced, said third capacitance element is connected in parallel with said first capacitance element, and when the second indication is produced said third capacitance element is connected in parallel with said second capacitance element; and a fourth switching element connected to operate such that, when the first indication is produced, said fourth capacitance element is connected in parallel with said first capacitance element, and when the second indication is produced, said fourth capacitance element is connected in parallel with said second capacitance element.

6. A filter according to claim 1, wherein said control means comprise current charging means for raising the potential at said output terminal and current discharging means for lowering the potential at said output terminal.

7. A filter according to claim 6, wherein each indication is representative of a respective polarity of the difference in phase between an input signal and a signal based on the output of the oscillator.

8. A filter for supplying a control voltage for a voltage-controlled oscillator in response to the input of either one of a first indication or a second indication, the first indication being effective for increasing the oscillator output frequency and the second indication being effective for decreasing the oscillator output frequency, the filter including a power supply capable of being turned on and off, wherein said filter comprises:
  a plurality of capacitance elements, first and second power supply potential points between which a fixed potential difference is established when said power supply is turned on, and an output terminal connected to supply a control voltage to the oscillator; and
  first switching means connected and operable for controlling the connections of said capacitance elements, said switching means being controlled by the indications such that:
    (a) when the power supply is turned on or neither indication is being input, a number of said capacitance elements are connected in parallel between said output terminal and said first power supply potential point and an equal number of said capacitance elements are connected in parallel between said output terminal and said second power supply potential point;
    (b) when the first indication is input, the number of said capacitance elements which are connected in parallel between said output terminal and said first power supply potential point is greater than the number of said capacitance elements which are connected in parallel between said output terminal and said second power supply potential point; and
    (c) when the second indication is input the number of said capacitance elements which are connected in parallel between said output terminal and said second power supply potential point is greater than the number of said capacitance elements which are connected in parallel between said output terminal and said first power supply potential point.

9. A filter according to claim 8, wherein said filter further comprises second switching means connected and operable such that, when the first indication is input, a first current path is formed between said output terminal and said first power supply potential point, and when the second indication is input, a second current path is formed between said output terminal and said second power supply potential point.

10. A method for controlling the frequency of the output signal produced by a voltage controlled oscillation device having a defined output frequency range, by means of a control circuit composed of an output terminal connected to the oscillation device for supplying a control voltage thereto, first and second power supply potential points, a first capacitance between the output terminal and the first power supply potential point, and a second capacitance between the output terminal and the second power supply potential point, said method comprising:
  upon establishment of a potential difference between the first and second potential points, giving the first and second capacitances values for causing the voltage at the output terminal to have a value which causes the output frequency of the signal produced by the oscillation device to be at least approximately at the center of the output frequency range;
  varying the output frequency in a first direction by making the first capacitance larger than the second capacitance; and
  varying the output frequency in a second direction opposite to the first direction by making the second capacitance larger than the first capacitance.

11. A filter for supplying a control voltage for a voltage-controlled oscillator in order to selectively increase or decrease the oscillator output frequency, said filter comprising:
  a power supply which supplies an output voltage and is capable of being turned on and off; an output node connectable to supply the control voltage for the oscillator; capacitance elements; charging and discharging means; and switchng means operable for connecting said capacitance elements and said charging and discharging means between said power suppoly and said output node in first and second connection patterns for providing, at said output node, a control voltage having a first value which reduces the oscillator output frequency when the first connection pattern is established, a second value which increases the oscillator output frequency when the second connection pattern is established, and a third value, which is between the first and second values and which has a fixed relation to the value of the output voltage, when said power supply is turned on and neither the first connection pattern nor the second connection pattern is established.

12. A filter according to claim 11 wherein said power supply has first and second power supply potential poins between which a potential difference is established, and wherein said capacitance elements includes a first capacitance element connected between said output node and said first power supply potential point, a second capacitance element connected between said output node and said second power supply potential point, and third and fourth capacitance elements connected to said switching means so that each of said third and fourth capacitance elements is selectively connectable in parallel with either one of said first and second capacitance elements by operation of said switching means.

* * * * *